(12) United States Patent
Whetsel

(10) Patent No.: US 7,694,199 B2
(45) Date of Patent: Apr. 6, 2010

(54) THREE BOUNDARY SCAN CELL SWITCHES CONTROLLING INPUT TO OUTPUT BUFFER

(75) Inventor: Lee D. Whetsel, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/251,587

(22) Filed: Oct. 15, 2008

(65) Prior Publication Data

US 2009/0037785 A1 Feb. 5, 2009

Related U.S. Application Data

(60) Division of application No. 11/745,532, filed on May 8, 2007, now Pat. No. 7,454,677, which is a division of application No. 10/773,784, filed on Feb. 6, 2004, now Pat. No. 7,231,566, which is a division of application No. 09/686,709, filed on Oct. 11, 2000, now Pat. No. 6,694,465, which is a division of application No. 09/154,381, filed on Sep. 16, 1998, now abandoned, which is a continuation of application No. 08/949,429, filed on Oct. 14, 1997, now abandoned, which is a continuation of application No. 08/910,536, filed on Jul. 24, 1997, now Pat. No. 5,859,860, which is a continuation of application No. 08/711,137, filed on Sep. 9, 1996, now Pat. No. 5,701,307, which is a continuation of application No. 08/357,476, filed on Dec. 16, 1994, now abandoned.

(51) Int. Cl.
*G01R 31/28* (2006.01)

(52) U.S. Cl. .................................. 714/726; 714/727
(58) Field of Classification Search ................. 714/726, 714/727
See application file for complete search history.

(56) References Cited

U.S. PATENT DOCUMENTS

| 4,875,003 | A | * | 10/1989 | Burke ........................ 714/736 |
| 5,220,281 | A | * | 6/1993 | Matsuki ...................... 714/727 |
| 5,384,494 | A | * | 1/1995 | Henson et al. ............... 327/202 |
| 5,473,617 | A | * | 12/1995 | Farwell ....................... 714/727 |

* cited by examiner

*Primary Examiner*—Kevin L Ellis
*Assistant Examiner*—Steve Nguyen
(74) *Attorney, Agent, or Firm*—Lawrence J. Bassuk; W. James Brady; Frederick J. Telecky, Jr.

(57) ABSTRACT

A process initializes the state of an output memory circuit of a scan cell located at the boundary of a logic circuit within an integrated circuit. Data is scanned into an input memory circuit of the cell while maintaining the cell in a mode providing normal operation of the logic circuit. The cell is placed in a test mode that disables normal operation of the logic circuit. The data scanned into the input memory circuit is transferred into the output memory circuit simultaneous with the placing the cell in the test mode. A transmission gate between the logic circuit and the output memory circuit and a transmission gate between the input memory circuit and the output memory circuit effect the changes between normal operation and test modes.

5 Claims, 9 Drawing Sheets

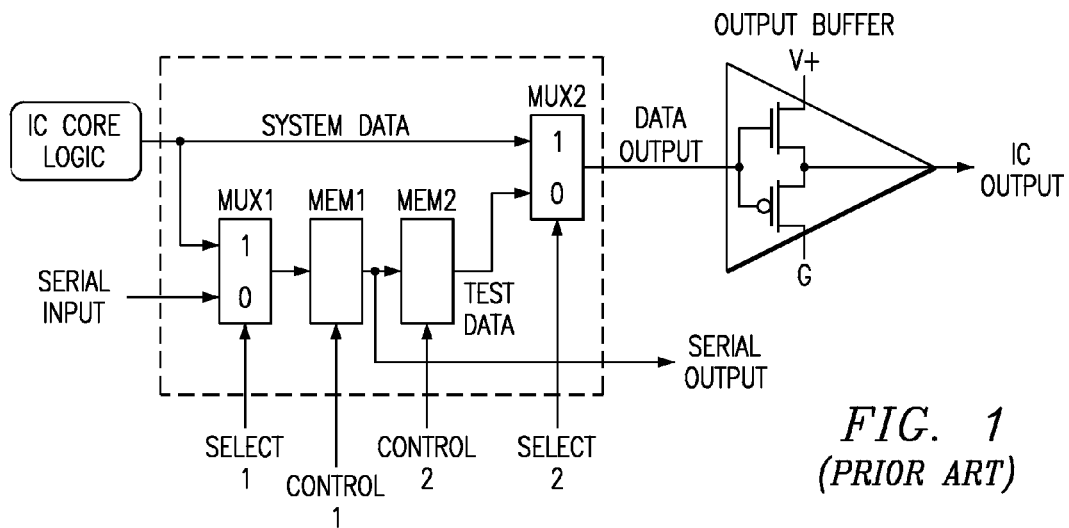
FIG. 1
(PRIOR ART)
FIG. 1A
(PRIOR ART)
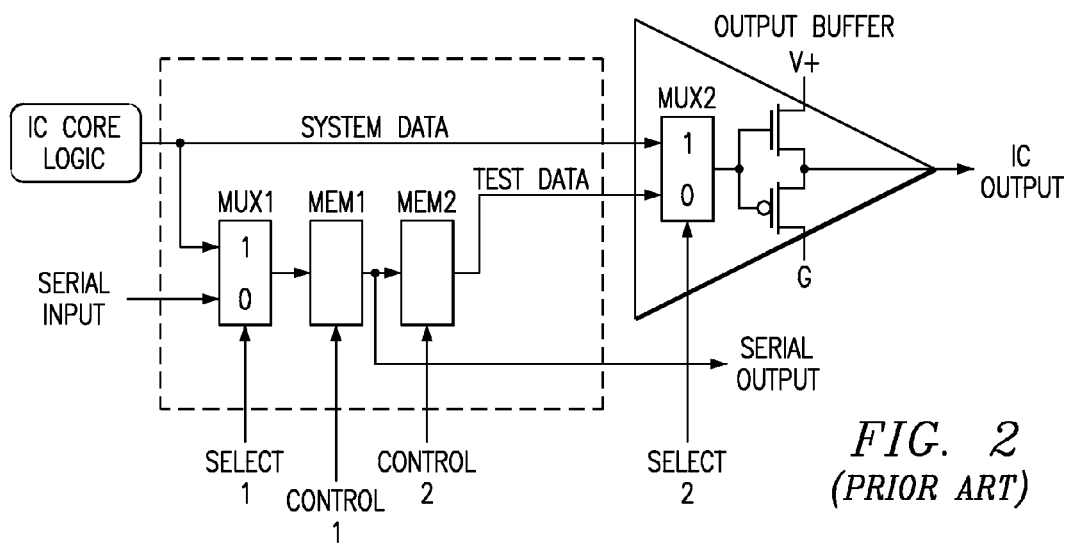
FIG. 2
(PRIOR ART)

| OPERATION | SAMPLE | EXTEST | INTEST |
|---|---|---|---|
| SELECT 1  | 0 1 0 0 0 0 0 0 0 0 | 0 1 0 0 0 0 0 0 0 0 | 0 1 0 0 0 0 0 0 0 0 |
| CONTROL 1 | 0 C C C C C C C 0 0 | 0 C C C C C C C 0 0 | 0 C C C C C C C 0 0 |
| CONTROL 2 | 0 0 0 0 0 0 0 0 C 0 | 0 0 0 0 0 0 0 0 C 0 | 0 0 0 0 0 0 0 0 0 0 |
| SELECT 2  | 1 1 1 1 1 1 1 1 1 1 | 0 0 0 0 0 0 0 0 0 0 | 0 0 0 0 0 0 0 0 0 0 |
| SELECT 3  | 0 0 0 0 0 0 0 0 0 0 | 1 1 1 1 1 1 1 1 1 1 | 0 0 0 0 0 0 0 0 0 0 |

→ TIME

| OPERATION | EXTEST1 | EXTEST2 | EXTEST3 |
|---|---|---|---|
| SELECT 1  | 0 1 0 0 0 0 0 0 0 0 | 0 1 0 0 | 0 1 0 0 0 0 0 0 0 0 |
| CONTROL 1 | 0 C C C C C C C 0 0 | 0 C 0 0 | 0 C C C C C C C 0 0 |
| CONTROL 2 | 0 0 0 0 0 0 0 0 C 0 | 0 0 C 0 | 0 0 0 0 0 0 0 0 C 0 |
| SELECT 2  | 0 0 0 0 0 0 0 0 0 0 | 0 0 0 0 | 0 0 0 0 0 0 0 0 0 0 |
| SELECT 3  | 1 1 1 1 1 1 1 1 1 1 | 1 1 1 1 | 1 1 1 1 1 1 1 1 1 1 |

→ TIME

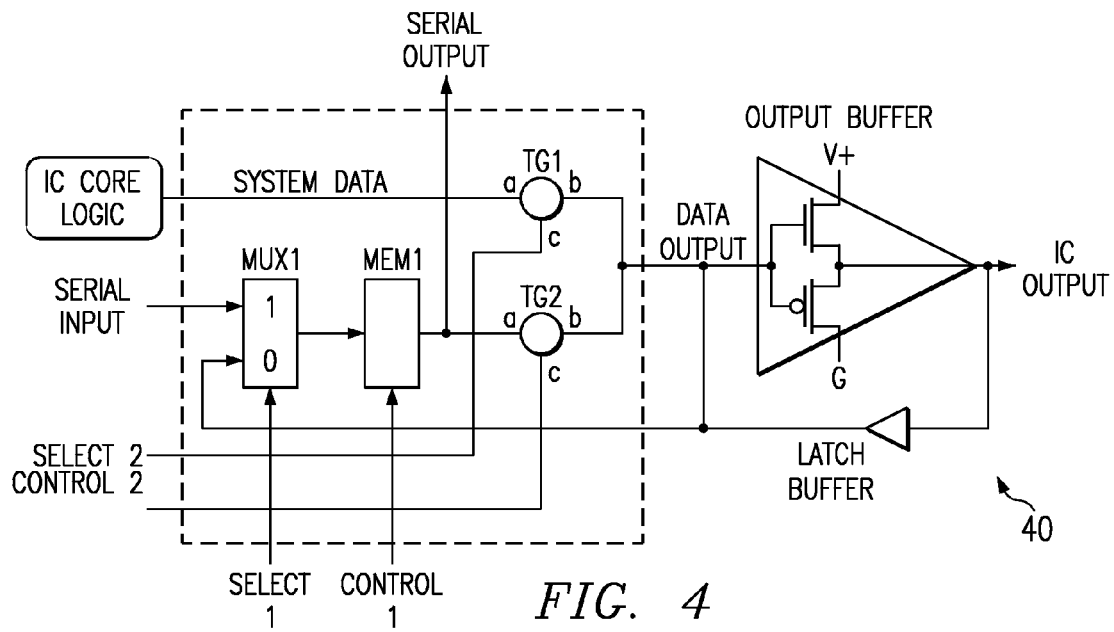
FIG. 4
FIG. 4A
FIG. 4B
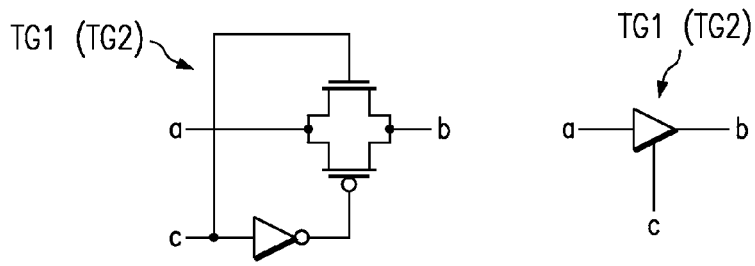
FIG. 5

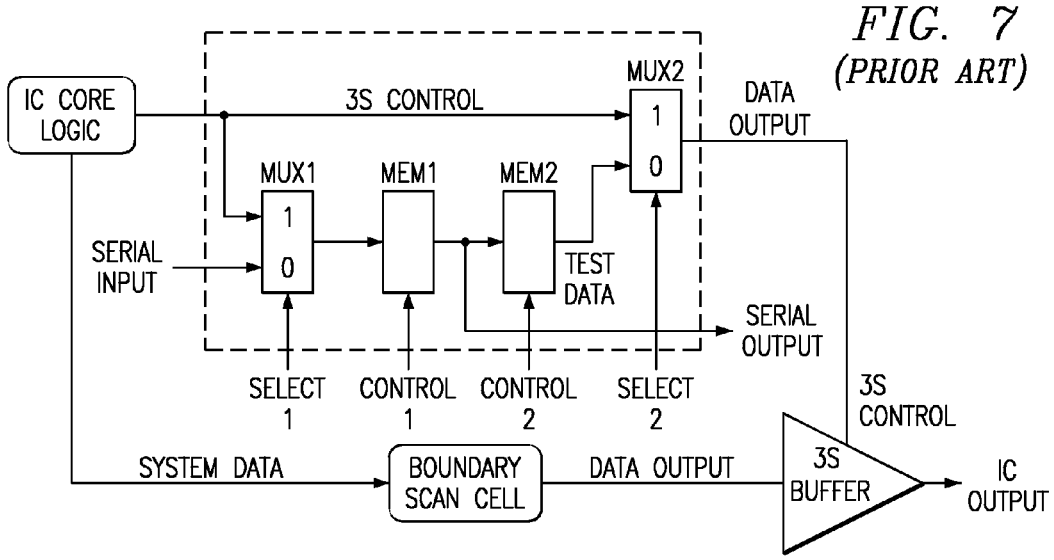
FIG. 6B
FIG. 7 (PRIOR ART)
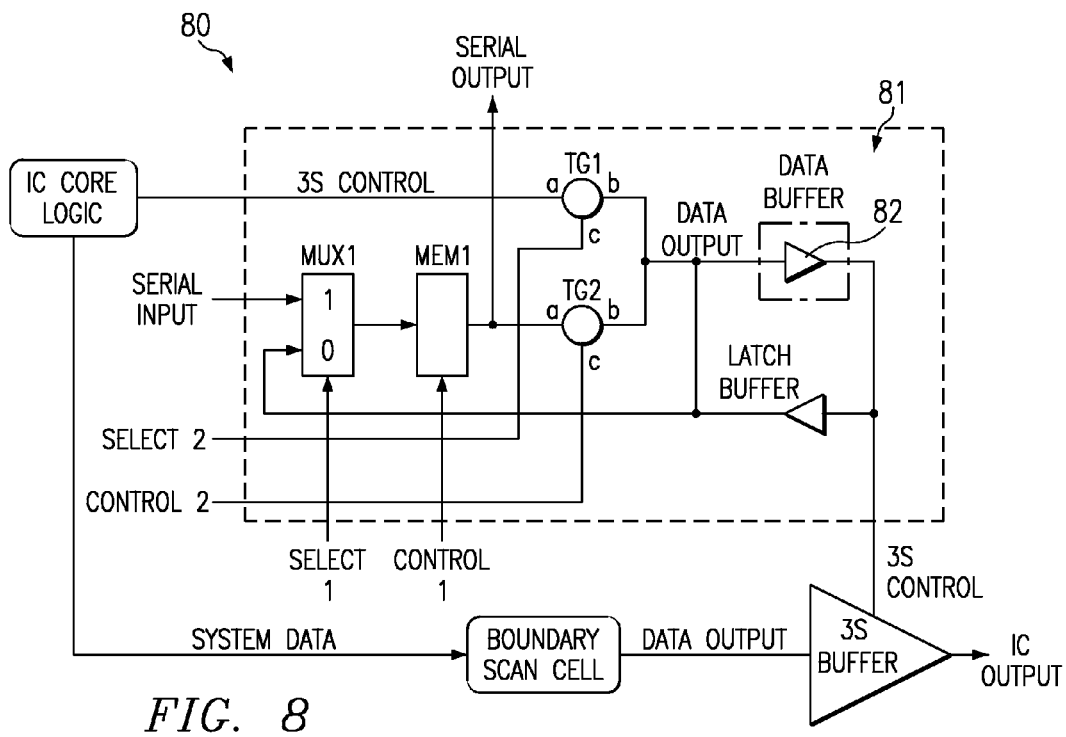
FIG. 8

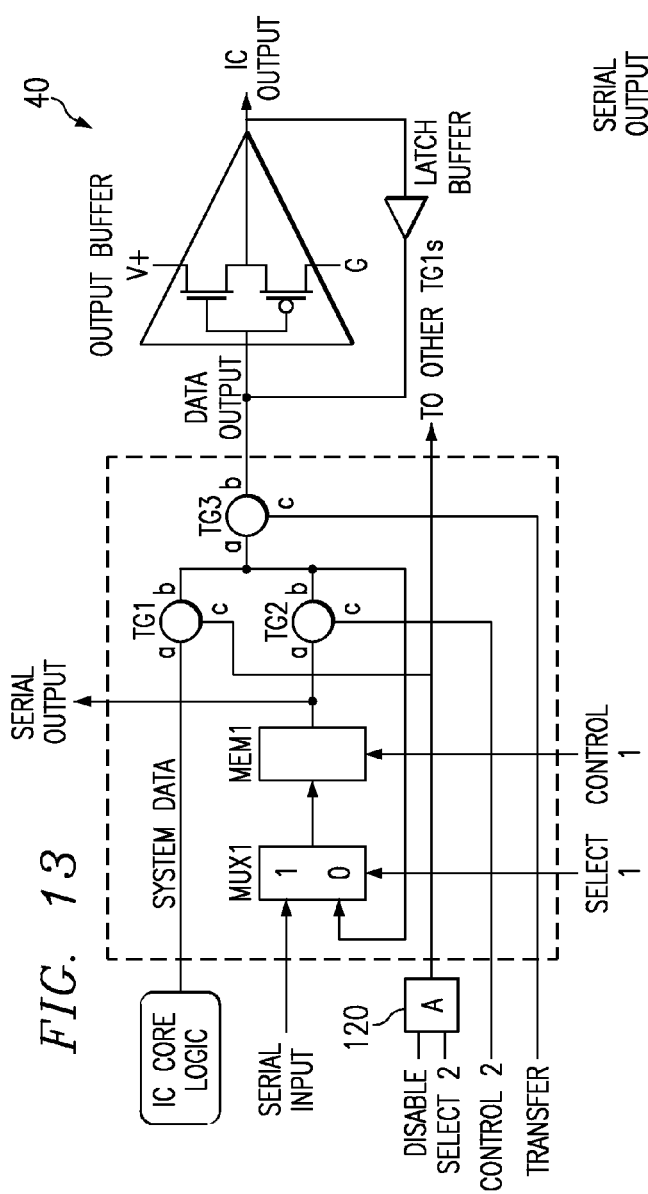
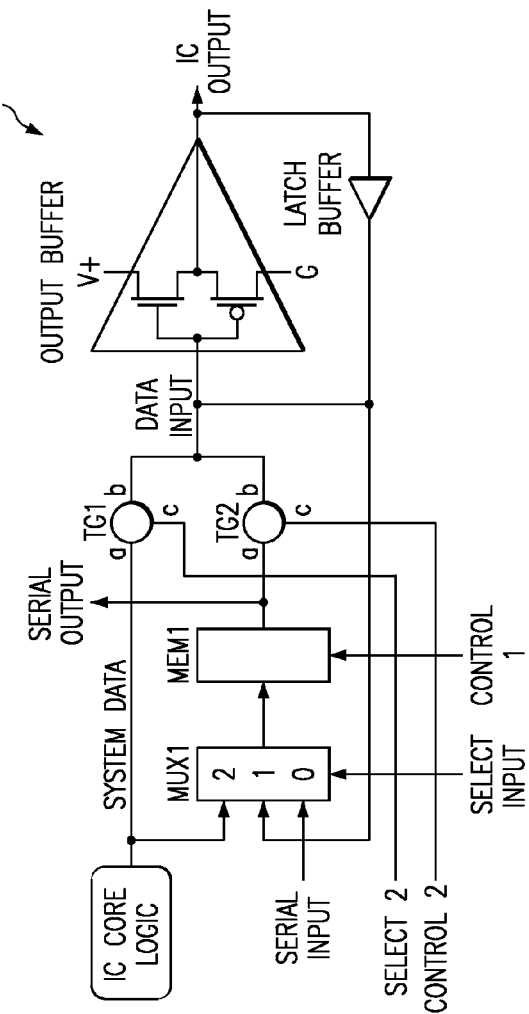
FIG. 13
FIG. 14

THREE BOUNDARY SCAN CELL SWITCHES CONTROLLING INPUT TO OUTPUT BUFFER

CROSS-REFERENCE TO RELATED APPLICATIONS

This application is a divisional of application Ser. No. 11/745,532, filed May 8, 2007, now U.S. Pat. No. 7,454,677, granted Nov. 18, 2008;

which was a divisional of application Ser. No. 10/773,784, filed Feb. 6, 2004, now U.S. Pat. No. 7,231,566, issued Jun. 12, 2007;

which was a divisional of application Ser. No. 09/686,709, filed Oct. 11, 2000, now U.S. Pat. No. 6,694,465, granted Feb. 17, 2004;

which was a divisional of application Ser. No. 09/154,381, filed Sep. 16, 1998, now abandoned;

which was a continuation of application Ser. No. 08/949,429, filed Oct. 14, 1997, now abandoned;

which was a continuation of application Ser. No. 08/910,536, filed Jul. 24, 1997, now U.S. Pat. No. 5,859,860, granted Jan. 12, 1999;

which was a continuation of application Ser. No. 08/711,137, filed Sep. 9, 1996, now U.S. Pat. No. 5,701,307, granted Dec. 23, 1997;

which was a continuation of application Ser. No. 08/357,476, filed Dec. 16, 1994, now abandoned.

The subject matter of the present application is related to subject matter disclosed in the following co-assigned, U.S. patent documents which are incorporated herein by reference: application Ser. No. 08/358,128, filed Dec. 16, 1994, now abandoned; application Ser. No. 08/342,525, filed Nov. 21, 1994, now U.S. Pat. No. 5,732,091, issued Mar. 24, 1998; and application Ser. No. 08/342,948, filed Nov. 21, 1994, now U.S. Pat. No. 5,715,254, issued Feb. 3, 1998.

TECHNICAL FIELD OF THE INVENTION

The invention relates to integrated circuits (ICs) and, more particularly, to boundary scan cells implemented at input and output pins of ICs to simplify testing of the ICs and their wiring interconnections.

BACKGROUND OF THE INVENTION

Boundary scan testing is very well known in the art and is supported by an IEEE standard (IEEE 1149.1) which details its implementation and operation modes. FIG. 1 illustrates the logic arrangement of a prior art boundary scan cell for use in boundary scan testing at IC outputs. The boundary scan cell contains an input multiplexer (Mux1), a capture/shift memory (Mem1) such as a flip-flop or other latch circuit, an output memory (Mem2) such as a flip-flop or other latch circuit, and an output multiplexer (Mux2). Mux1 is controlled by a select signal (Select 1) to allow Mem1 to load data from either the serial data input or the system data output by the IC core logic. Mem1 loads data in response to a control signal (Control 1). The output of Mem1 is input to Mem2 and is output as serial data. Mem2 loads data from Mem1 in response to a control signal (Control 2). Mux2 is controlled by a select input (Select 2) to allow it to output to the IC's output buffer either the output of Mem2 or the system data from the IC core logic. A plurality of these boundary scan cells can be connected serially, via the serial input and output lines, to form a boundary scan register.

In FIG. 1, the output boundary scan cell logic is enclosed in dotted lines. The boundary scan cell connects an output from the IC's core logic to the IC's output buffer. The output buffer outputs a high (V+) or low (G) voltage in response to the logic level it receives from Mux2. The boundary scan cell is realized in the same region of the IC as the core logic, i.e., the core region. In most instances, i.e. when implemented in accordance with the rules stated in the IEEE 1149.1 standard, the boundary scan cell logic is dedicated for test purposes and is not shared with system logic functions. In this way, the boundary scan cell can be accessed for non-intrusive test operations without disturbing the IC's normal functional operation.

The IEEE 1149.1 standard defines three types of test operations for boundary scan cells, a sample test operation (Sample), an external test (Extest) and internal test (Intest). Sample is a required test mode for 1149.1. During Sample, the IC is in normal operation (i.e. IC's core logic is connected to the output buffers via Mux2) and Mux1 and Mem1 are operated to capture and shift out normal IC output data. Extest is another required test mode for 1149.1. During Extest, output boundary scan cells are used to drive test data from IC outputs onto wiring interconnects, and input boundary scan cells are used to capture the driven test data at IC inputs. In this way, Extest can be used to test wiring interconnects between IC inputs and outputs on a board Intest is an optional test mode for 1149.1. During Intest, input boundary scan cells are used to drive test data to the IC's core logic, and output boundary scan cells are used to capture the response from the core logic. In this way, Intest can be used to test IC core logic.

During normal IC operation, the output of the IC's core logic passes through Mux2, to the output buffer, and is driven off the IC by the output buffer. Therefore, during normal mode, the IC output function is not effected by the boundary scan cell, except for the delay introduced by Mux2. If, during normal operation, a Sample is performed, the boundary scan cell receives Select 1 and Control 1 input to capture system data and shift it out for inspection via the serial output.

During test operation, the output of the ICs core logic is received by the boundary scan cell for capturing and shifting, but Mux2 is controlled by Select 2 to output the test data stored in Mem2 to the output buffer. Therefore, during test mode, the IC core logic output function is disabled by the boundary scan cell. If, during test operation, an Extest or Intest is performed, the boundary scan cell receives Select 1 and Control 1 inputs to capture system data into Mem1 and shift it out for inspection via the serial output. While Mem1 is capturing and shifting data, Mem2 outputs stable test data to the output pin. After Mem1 has completed its capture and shift operation in Extest it contains new test data to be loaded into Mem2. Mem2 loads the new test data from Mem1 in response to a signal on Control 2. After Mem2 receives the new test data, it is output from the IC via Mux2 and the output buffer. The purpose for Mem2 is to latch the IC's output at a desired test logic state while Mem1 is capturing and shifting data. Without Mem2, i.e. if the output of Mem1 were connected to Mux2 directly, the IC's output would transition between logic (i.e. ripple) states as data is captured into and shifted through Mem1.

Examples of the boundary scan cell of FIG. 1 performing Sample, Extest and Intest operations are illustrated in the timing diagram of FIG. 1A. In the timing diagram of FIG. 1A and all following timing diagrams, "C" indications on the Control 1 and Control 2 signals indicate a low-high-low signal sequence which; in the example circuits shown, provides the control to store data into Mem1 and Mem2, respectively. Logic zero and one levels on the Select 1 and Select 2 signals indicate logic levels used to control the operation of Mux5 and Mux2, respectively. Also, seven Control 1 "C" signals are used in all example timing diagrams. The first Control 1 "C" signal indicates the capture of data into Mem1, and the following six Control "C" signals represent the shifting of data through six serially connected boundary scan cell circuits.

In FIG. 2, a known improvement to the boundary scan cell of FIG. 1 is shown. The improvement is brought about by realizing Mux2 in the buffer region of the IC's output buffer. Relocating test logic in the IC buffer region frees up area in the IC's core logic for system (non-test) logic functions. The logic required in the IC's core region is reduced by the size of Mux2 for each required output boundary scan cell. This leaves only the boundary scan cell's Mux1, Mem1, and Mem2 as test logic overhead in the IC's core region. The amount of boundary scan cell logic that needs to be placed and routed in the IC's core region is reduced. The boundary scan cell of FIG. 2 operates exactly like the one of FIG. 1.

FIG. 3 illustrates another known improvement to the boundary scan cell of FIG. 1. This improvement was described in 1990 by D. Bhavsar on pages 183-189 of IEEE Society Press Publication "Cell Designs that Help Test Interconnection Shorts". The improvement allows the logic output from the output buffer to be captured and shifted out of Mem1 during Extest. This feature allows detecting shorts between pins or to supply voltages or ground that conflict with the logic level attempting to be driven out of the output buffer. For example, during Extest, if a logic one is driven from Mem2 the output buffer will attempt to drive out a logic one. However, if the output of the output buffer is shorted to ground a high current (or low impedance) path exists in the output buffer from V+ through the top transistor to ground, which can result in a damaged or destroyed output buffer. Similarly if Mem2 is driving out a logic zero and the output of the output buffer is shorted to a supply voltage, a high current (low impedance) path exists through the bottom transistor to ground (G), again resulting in a damaged or destroyed output buffer. The boundary scan cell of FIG. 3 allows detecting these short circuit conditions by the addition of a third multiplexer (Mux3), a third select input (Select3), and an input buffer. The input buffer inputs the logic state at the output of the output buffer. Mux3 inputs the system data and the logic state of the output buffer, via the input buffer, and outputs a selected one of these signals to one input of Mux1. In this example, Mux3 selects the system logic if Select 3 is low (Intest) or the output buffer state if Select 3 is high (Extest). In this way, Mem1 captures and shifts system data from the IC's core logic during Sample and Intest, and test data from the input buffer during Extest.

Examples of the boundary scan cell of FIG. 3 in Sample, Extest, and Intest operation are illustrated in the timing diagram of FIG. 3A The boundary scan cell of FIG. 3 also allows reducing the time that an output can be shorted. In the timing diagram of FIG. 3B, it is seen that after a full Extest operation, Extest 1 (i.e. the Capture & Shift of Mem1 and the Updating of Mem2), a short Extest operation, Extest 2 (i.e. the Capture Only of Mem1 (no shift) and Update of the captured data to Mem2), can be performed. The Extest 2 operation allows test data from the output to be updated into Mem2 to correct any voltage conflict on the output. For example, if the Extest 1 operation had attempted to output a logic one on the output buffer, with the IC output shorted to ground, and the Extest 2 operation captured and updated a logic zero (due to the short to ground), the amount of time the output buffer was in the high current situation (V+ to G through top transistor) is reduced to the number of TCK periods it takes to go from the update step of Extest 1 to the update step of Extest 2, TCK being, for example, the test clock of IEEE 1149.1. The next full Extest operation (Extest 3) captures and shifts out the logic zero to indicate the short to ground and the resulting change in state of Mem2, brought about by the short Extest operation (Extest 2). If no short to ground existed, then the Extest 2 operation would have reloaded Mem2 with the logic one from the Extest 1 operation, and the Extest 3 operation would have verified the logic one at the IC output.

While this approach reduces the amount of time a voltage conflict can exist at an IC output, the time it takes to execute the corrective Extest scan operations, i.e. Extest 1 to Extest 2 update times in FIG. 3B, may still endanger the output buffer. Also when the IC is first powered up in its normal mode, output conflicts due to shorts can exist for an extended amount of time before a test mode is entered, if entered at all. So while the boundary scan cell of FIG. 3 does provide short circuit detection and correction improvements over the one in FIG. 1, it requires time to make the corrections and does not provide protection at power up where the IC immediately enters its normal operation. Also the boundary scan cell of FIG. 3 requires an additional Mux3, Select 3 signal, and input buffer to achieve the short circuit detection and correction feature.

It is desirable in view of the foregoing to implement at least the functionality of the prior art boundary scan cells using less of the IC core area To this end, the present invention: provides a boundary scan cell that requires less logic in the IC core region than prior art boundary scan cells; utilizes the IC output buffer as part of output boundary scan cells, and the IC input buffer as part of input boundary scan cells; provides latchable input and output buffer circuits that serve the function of Mem2 in the prior art boundary scan cells; integrates the functions of Mux2 and Mem2 into IC input and output buffers to facilitate boundary scan cell logic reduction in the IC core region; provides a boundary scan cell and output buffer combination that can immediately and asynchronously detect and correct short circuit conditions on output pins during Extest operation; provides a boundary scan cell and output buffer combination that can immediately and asynchronously detect and correct short circuit conditions on output pins when the IC is initially powered up in its normal mode; and provides an IC power up method and procedure that prevents IC output buffers from being damaged or destroyed by short circuits.

BRIEF DESCRIPTION OF THE DRAWINGS

FIGS. 1-3 illustrate prior art output boundary scan cell structures.

FIG. 1A includes three timing diagrams which illustrate three different test operations performed by the prior art output boundary scan cell structure of FIG. 1.

FIG. 3A includes three timing diagrams which illustrate three different test operations performed by the prior art output boundary scan cell structure of FIG. 3.

FIG. 3B includes three timing diagrams which illustrate a sequence of test operations performed by the prior art output boundary scan cell structure of FIG. 3 to detect and correct for short circuits at the IC output.

FIG. 4 illustrates an exemplary output boundary scan cell structure according to the present invention.

FIG. 4A includes two timing diagrams which illustrate two different test operations performed by the output boundary scan cell structure of FIG. 4.

FIG. 4B includes a timing diagram which illustrates another test operation performed by the output boundary scan cell structure of FIG. 4.

FIG. 5 illustrates exemplary circuitry for realizing the transmission gates of FIG. 4.

FIG. 6B includes two timing diagrams which illustrate two additional test operations performed by the output boundary scan cell structure of FIG. 6.

FIG. 7 illustrates a prior art output boundary scan cell structure for use with a three-state output.

FIG. 8 illustrates an exemplary output boundary scan cell structure according to the present invention for use with a three-state output.

FIG. 13 illustrates a modification of the structure of FIG. 6 to permit safe power up of an IC whose outputs are shorted.

FIG. 14 illustrates another exemplary output boundary scan cell structure according to the present invention.

DETAILED DESCRIPTION OF THE INVENTION

Figures 3, 3A, 3B:
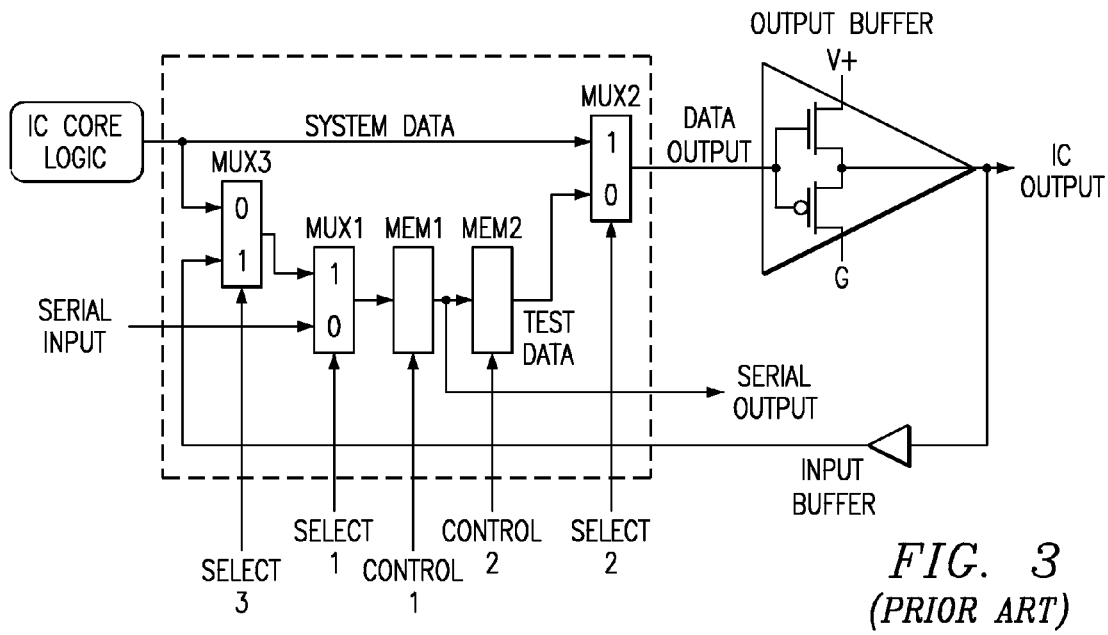
Figures 6, 6A:
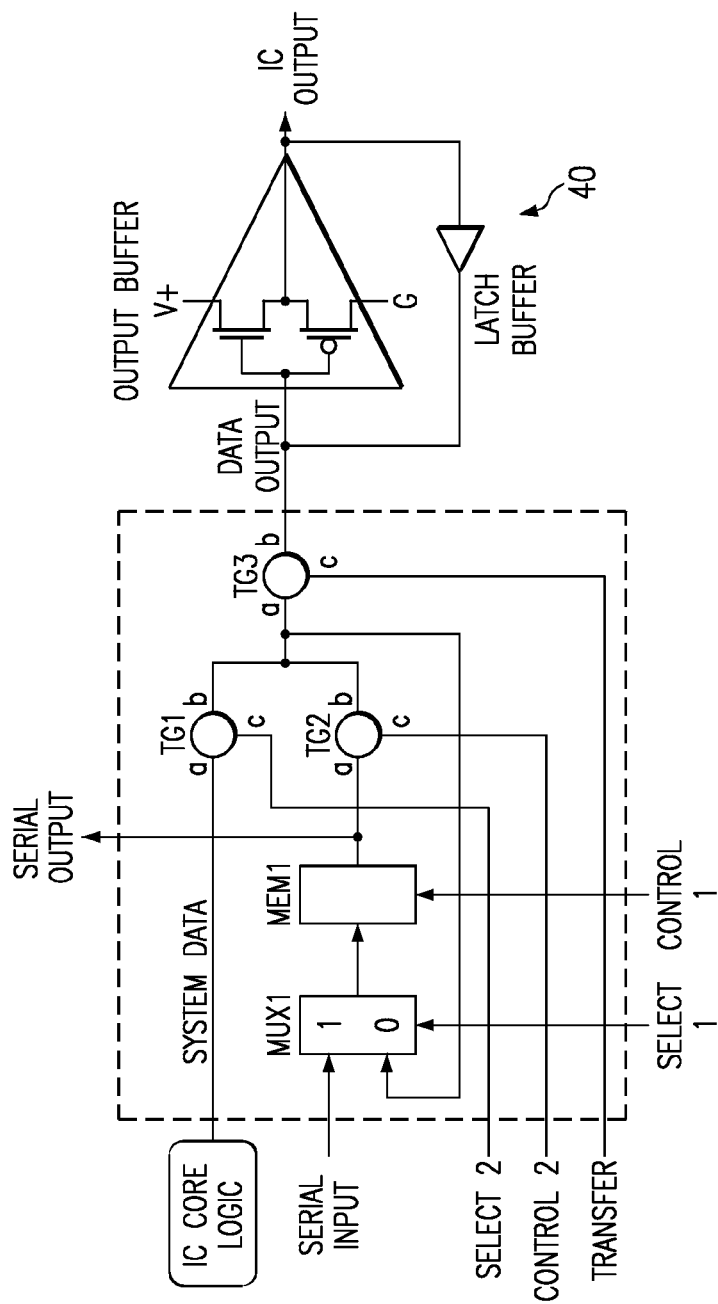
FIG. 6 illustrates another exemplary output boundary scan cell structure according to the present invention.
FIG. 6A includes three timing diagrams which illustrate three different test operations performed by the output boundary scan cell structure of FIG. 6.

FIGS. 4 and 6 illustrate exemplary output boundary scan cells according to the invention, containing all the features of the prior art output boundary scan cells of FIGS. 1-3 plus an improved short circuit detection and correction method, while requiring significantly less logic in the IC's core region. The boundary scan cells of FIGS. 4 and 6 provide the following improvements over prior art output boundary scan cells; (1) increased boundary scan cell functionality, (2) reduced boundary scan cell logic overhead, and (3) improved output buffer short circuit protection. The boundary scan cell of FIG. 4 is designed to perform only the required 1149.1 Sample and Extest operations, whereas the boundary scan cell of FIG. 6 is designed to perform the required Sample and Extest operations, as well as the optional Intest operation.

In FIG. 4, the boundary scan cell logic includes Mux1, Mem1, two transmission gates (TG1 and TG2), and a latch buffer. While transmission gates are used in FIG. 4, other signal transfer or switching elements could also be used, such as tristatable buffers. Examples of a transmission gate arrangement and a tristatable buffer that could serve as TG1 and TG2 are shown in FIG. 5. The Mem2 function of the prior art is realized by the combination of the IC output buffer, the latch buffer, and TG2. The Mem2 function and IC core logic thus share use of the IC output buffer. The Mux2 function of the prior art examples is realized by TG1 and TG2. The output of the IC output buffer is connected to the input of the latch buffer. The output of the latch buffer is connected to the input of the output buffer. In this arrangement, a latchable output buffer 40 is obtained when TG1 and TG2 are disabled. The latching operation is realized by the latch buffer feedback which allows the output of the output buffer to drive the input of the output buffer.

In normal operation of the IC, TG1 is enabled to pass system data to the input of the output buffer, and TG2 is disabled. In test operation of the IC, TG2 is enabled to pass test data from Mem1 to the input of the latchable output buffer 40 (which serves as Mem2), and TG1 is disabled. The latch buffer is designed with a weak enough output so that when TG1 or TG2 is enabled, either can overdrive the output of the latch buffer. However, when TG1 and TG2 are disabled, the output from the latch buffer is sufficient to maintain at the output buffer's input a logic level fed back from the IC output, thus providing a latching feature which performs the Mem2 function. If desired, one or both of TG1 and TG2 could be realized in the IC's output buffer region, to further reduce the amount of boundary scan cell logic in the IC's core region to as little as Mux1 and Mem1. The positions of the Mux2 and Mem2 functions are reversed in FIG. 4 as compared to the prior art examples in FIGS. 1-3, i.e. the Mem2 function (TG2, latch buffer, and output buffer) appears after the Mux2 function (TG1 and TG2).

During Sample operation, the IC is in normal mode wherein Select 2 enables TG1 and Control 2 disables TG2. The Control 2 signal is not active during normal operation and remains low to disable TG2. One way of keeping Control 2 inactive would be to gate it off with the Select 2 signal during normal operation. In normal operation mode, the output of the IC's core logic (system data) passes through TG1 to be input to the latchable output buffer 40 and driven off the IC. Therefore, during normal operation, the IC output function is not affected by the boundary scan cell, except for the delay introduced by TG1. During Sample, the boundary scan cell receives Select 1 and Control 1 input to first capture into Mem1 the system data output from TG1 to Mux 1, and then shift the captured data out for inspection via the serial output. The prior art cells capture system data entering Mux2 during Sample, whereas the boundary scan cell of FIG. 4 captures system data leaving TG1. An example of the boundary scan cell in Sample operation is illustrated in the timing diagram of FIG. 4A This timing diagram is the same as the one for the prior art cells, except that Control 2 remains low during normal operations (and thus during Sample) to insure that TG2 does not become enabled.

During Extest operation, Select 2 disables TG1, therefore disabling the IC core logic from outputting data to the latchable output buffer 40. When the boundary scan cell of FIG. 4 is first placed into Extest operation, the latchable buffer 40 needs to be loaded with the output from Mem1. To achieve this, a preload signal is output on Control 2 to cause TG2 to be enabled to drive the logic value from Mem1 to the latchable output buffer 40. After the preload signal on Control 2 goes away, TG2 is disabled and the latch buffer is used to maintain the logic value at the IC output. This preloading of the latchable output buffer is required the first time the cell is placed in Extest operation mode. After the initial preload operation is performed, all other logic transfers from Mem1 to the latchable output buffer will occur as the Mem1 to Mem2 transfers were described in the prior art boundary scan cells, i.e. in response to Control 2 input.

In Extest operation mode, the output of the latch buffer is input to Mux1 for capturing and shifting while the latchable output 40 buffer outputs stable test data. Connecting Mux1 to the output of the latch buffer allows observation of the IC output as in the prior art boundary scan cell of FIG. 3. During Extest operation, the boundary scan cell receives Select 1 and Control 1 input to capture the IC output pin data into Mem1 and then shift it out for inspection via the serial output. While Mem1 is capturing and shifting data, TG2 is disabled by Control 2 to allow the latchable output buffer 40 to maintain stable test data at the output pin. After Mem1 has completed its capture and shift operation it contains new test data to be loaded into the latchable output buffer 40. The latchable output buffer 40 Loads the new test data from Mem1 via TG2 in response to a signal on Control 2. When the latchable output buffer 40 receives new test data, the data is output directly to the output pin. Mem2 of the prior art cells outputs new test data to the output pin by first passing the data through Mux2, i.e. not directly to the output buffer. An example of the boundary scan cell in Extest operation is illustrated in the timing diagram of FIG. 4A. Note that the preload signal on Control 2, described above to initially transfer the logic value from Mem1 to the latchable output buffer 40 at the beginning of the Extest operation, is not shown in the FIG. 4A timing diagram, but has already occurred when the Extest operation of FIG. 4A is entered. Note also that the cell of FIG. 4 does not require the additional Mux3 and Select 3 signal required in the prior art cell of FIG. 3 to perform the short circuit detection and correction feature.

In FIG. 6, the boundary scan cell logic includes Mux1, Mem1, three transmission gates (TG1, TG2, and TG3), and a latch buffer. The boundary scan cells of FIG. 4 and FIG. 6 are identical except for the inclusion in FIG. 6 of TG3 between the outputs of TG1 and TG2 and the input to the latchable output buffer 40. While TG1 and TG2 can be any type of signal transfer element as shown for example in FIG. 5, TG3 must be able to transmit signals bi-directionally. So TG3 would need to operate as the transmission gate example of FIG. 5, or some other type of bi-directional signal transfer element. The reason for the bi-directional behavior of TG3 is discussed below. One or more of TG1, TG2, and TG3 could be implemented as part of the latchable output buffer 40 in the IC's output buffer region to reduce the amount of test logic in the IC core region to as little as Mux1 and Mem1.

In normal operation of the IC, TG1 and TG3 are enabled to pass system data to the input of the output buffer, and TG2 is disabled. In test operation of the IC, TG2 and TG3 are enabled to pass test data from Mem1 to the input of the output buffer, and TG1 is disabled. When TG3 is enabled it overdrives the output of the latch buffer to pass system or test data to the output pin. When TG3 is disabled, the latch buffer maintains feedback from the IC output to the input of the output buffer to latch and hold test data at the output pin.

During Sample operation, the IC is in normal mode wherein Select 2 enables TG1, a Transfer signal enables TG3, and Control 2 disables TG2. In normal operation mode, the output of the IC's core logic passes through TG1 and TG3 to be output from the latchable output buffer 40. During Sample, the boundary scan cell receives Select 1 and Control 1 input to first capture into Mem1 the system data output from TG1 to Mux1, and then shift the captured data out for inspection via the serial output. This Sample operation is thus the same as described for the cell of FIG. 4. An example of the FIG. 6 boundary scan cell in Sample operation is illustrated in the timing diagram of FIG. 6A.

During Extest operation, Select 2 disables TG1, therefore disabling the IC core logic from outputting data to the latchable output buffer 40. When the boundary scan cell of FIG. 6 is first placed into Extest operation, the latchable buffer 40 needs to be loaded with the output from Mem1. To achieve this, a preload signal is output on Control 2 and Transfer to cause TG2 and TG3 to be enabled to drive the logic value from Mem1 to the latchable output buffer 40. After preloading the latchable output buffer, TG2 and TG3 are disabled to allow the latchable output buffer to maintain the preloaded logic value at the output pin.

During the capture step of the Extest operation, TG2 is disabled by Control 2 and TG3 is momentarily enabled by Transfer to allow the output of the latch buffer to be captured into Mem1 via Mux1. After the capture step, TG3 is disabled and the shifting step of the Extest operation is performed. The latchable output buffer 40 remains stable during the shifting step via the latch buffer feedback. The momentary enabling of TG3 by the Transfer signal allows the IC output to be captured as in the prior art boundary scan cell of FIG. 3, but without the overhead of the additional Mux3 and Select 3 signal required in the FIG. 3 cell. After Mem1 has completed its capture and shift operation it contains new test data to be loaded into the latchable output buffer 40. The latchable output buffer loads (updates) the new test data from Mem1 in response to a momentary enabling of TG2 and TG3 by the Control 2 and Transfer signals. The latchable output buffer holds the new test data at the output pin when TG2 and TG3 are disabled after the data is transferred.

An example of the FIG. 6 boundary scan cell in Extest operation is illustrated in the timing diagram of FIG. 6A. Again, note that the preload signals on Control 2 and Transfer, described above to initially transfer the logic value from Mem1 to the latchable output buffer 40 at the beginning of the Extest operation, are not shown in the timing diagram of FIG. 6A, but have already occurred when the Extest operation of FIG. 6A is entered. Also note the bidirectional behavior of TG3 during the Extest capture and update operations. During the capture operation, TG3 is enabled by Transfer to pass data from the latchable output buffer 40 to Mem1 via Mux1, while during the update operation, TG3 is enabled by Transfer to pass data from Mem1 to the latchable output buffer 40.

During Intest operation in FIG. 6, Select 2 disables TG1, therefore disabling the IC core logic from outputting data to the latchable output buffer 40. When the boundary scan cell of FIG. 6 is first placed into Intest operation, the latchable output buffer 40 is preloaded with test data from Mem1 in the same manner as described in the Extest operation.

During the capture step of the Intest operation, TG1 is momentarily enabled by Select 2 while TG2 and TG3 remain disabled. Momentarily enabling TG1 allows system data from the IC core logic to be captured in Mem1 via Mux1. Since TG3 is disabled, the state of the latchable output buffer 40 is maintained during the capture step. After the capture step, TG1 is disabled along with TG2 and TG3 as the captured data is shifted out of Mem1. The momentary enabling of TG1 by Select 2 allows the IC's system data to be captured and shifted out as described in the Intest operation of the prior art boundary scan cell of FIGS. 1-3. After Mem1 has completed its capture and shift operation it contains new test data to be loaded (updated) into the latchable output buffer 40. The latchable output buffer 40 loads the new test data from Mem1 in response to a momentary enabling of TG2 and TG3 by the Control 2 and Transfer signals. The latchable output buffer 40 holds the new test data at the output pin when TG2 and TG3 are again disabled. An example of the boundary scan cell in Intest operation is illustrated in the timing diagram of FIG. 6A. Again, note that the preload signals on Control 2 and Transfer, described above to initially transfer the logic value from Mem1 to the latchable output buffer 40 at the beginning of the Intest operation, are not shown in the FIG. 6A timing diagram, but already have occurred when the Intest operation of FIG. 6A is entered.

While the above described way of loading (updating) Mem1 data into the latchable output buffer 40 during Extest and Intest is preferred for output pin short circuit protection (as will be described later), an alternate loading method is possible. The alternate method is similar to the one described above except that Control 2 for the cell of FIG. 4 and Control 2 and Transfer for the cell of FIG. 6 are activated to enable TG2 of FIG. 4 and TG2 and TG3 of FIG. 6, respectively, immediately when Extest or Intest is entered. This condition remains in effect during Extest and Intest except when data is being captured and shifted in Mem1. Using this alternate method, TG2 (FIG. 4) or TG2 and TG3 (FIG. 6) output Mem1 test data to the latchable output buffer 40 at all times except when Mem1 is capturing and shifting test data. During capture and shift operations, Control 2 or Control 2 and Transfer are operated as required (for example as described above with respect to FIGS. 4 and 6) to cause the appropriate data (output data for Extest or IC data for Intest) to be captured and shifted in Mem1. After the capture and shift operation completes, Control 2 or Control 2 and Transfer again enable TG2 or TG2 and TG3 to transfer test data to the latchable output buffer 40. Rather than the previously described momentary activation of Control 2 or Control 2 and Transfer to pass Mem1 data to the latchable output buffer 40, this alternate method uses continuous levels on Control 2 or Control 2 and Transfer to continuously transfer Mem1 data to the latchable output buffer except during Mem1 capture and shift operations. The operation of Control 2 or Control 2 and Transfer using this alternate control method is shown in the timing diagrams of FIGS. 4B and 6B.

One benefit of using momentary Control 2 or Control 2 and Transfer signals, rather than holding them at enabling levels, is that the momentary activation allows TG2 or TG2 and TG3 to pass test data to the latchable output buffer 40 during a short period of time, and then allows the latch buffer to latch and hold the test data at the output pin. Holding Control 2 or Control 2 and Transfer at enabled states forces TG2 or TG2 and TG3 to drive test data to the latchable output buffer 40 continuously, overriding the short circuit corrective action of the latch buffer feedback feature.

For example, if a short to ground existed on the IC output pin and the momentary control method were used to transfer a logic one from Mem1 to the latchable output buffer 40, the latchable output buffer would temporarily force (during the Control 2 or Control 2 and Transfer time) the output to a logic one. However, after the momentary control goes away, the latchable output buffer 40 would, due to the output feedback from the latch buffer, immediately switch from outputting a logic one to outputting a logic zero, thus removing the voltage contention at the IC output pin. If the alternate (continuous) control method were used to continuously transfer a logic one from Mem1 to the latchable output buffer 40, the latchable output buffer would attempt to continuously force the shorted output to a logic one for as long as Control 2 or Control 2 and Transfer are set high. The advantage of the momentary control method over the continuous control method then, is that it reduces the time a short circuit (or other voltage contention) condition can exist on an output pin, and therefore reduces the possibility of an output buffer being damaged or destroyed.

The boundary scan cells of FIGS. 4 and 6 provide improved short circuit protection over the method employed in prior art FIG. 3. In FIG. 3, the short circuits to ground or supply voltages (logic zero or one) are corrected by performing back to back scan operations (Extest 1 and Extest 2). The method of FIG. 3 allows a shorted output to be maintained for the number of TCK periods required to go from updating test data in Extest 1 to updating test data in Extest 2. Using the IEEE 1149.1 test standard timing as an example, a minimum of four TCK periods must occur between the above-described Extest 1 and Extest 2 update steps. Using the prior art boundary scan cell of FIG. 3, a short circuit will exist at an output pin for at least 4 TCK periods. TCK frequencies can range from single step rates of say 1 hertz, to free running rates of say 20 megahertz. While a low current output buffer may be able to tolerate a short of a given duration without complete destruction, a high current output buffer may not. Even if an output buffer appears to operate normally after being shorted for 4 TCK periods, it may be so degraded by the short as to significantly reduce its life expectancy in the field, causing early and unexpected system failures. Also, multiple pin shorts can occur, causing multiple output buffers to be stressed between update steps, causing heat to build up in the IC.

Using the boundary scan cells of the present invention in FIGS. 4 and 6, the latchable output buffer 40, when used in combination with the momentary control method of Control 2 (FIG. 4) or Control 2 and Transfer (FIG. 6), significantly reduces the time an output buffer can be forced into a short circuit condition. For example, the Control 2 or Control 2 and Transfer signals can be made to momentarily enable TG2 or TG2 and TG3 for only one half TCK period during update. After the momentary update enable goes away, the latch buffer provides feedback to correct for any output short condition immediately. In comparing short circuit correction times between the boundary scan cell of FIG. 3 (4 TCK periods) and those of FIGS. 4 and 6 (½ TCK period), the cells of the present invention correct shorts in 12.5% of the time it takes the prior art cell to correct shorts. Therefore the invention reduces the potential for output buffers to be degraded or destroyed during Extest or Intest operation. The reason for this improved short circuit protection provided by the invention is that the latchable output buffer 40 immediately and asynchronously corrects for logic differences between the input and the output of the output buffer using the latch buffer as a feedback mechanism.

When 3-state (3S) output buffers are used in ICs, FIG. 1 prior art boundary scan cells are placed at the data input and at the 3-state control input of the 3-state output buffer, as shown in FIG. 7. These boundary scan cells allow inputting system data and 3-state control to the 3-state buffer.

FIG. 8 shows an example of how a boundary scan cell similar to FIG. 4 can be used to control 3-state output buffers. During normal operation, the 3-state (3S) buffer of FIG. 8 is enabled or disabled by the 3S control output from the IC's core logic. In test operation, the 3-state buffer is enabled or disabled by the test data stored into the latchable output buffer 81 of the boundary scan cell 80 of FIG. 8. Note that the boundary scan cell 80 of FIG. 8 uses a normal data buffer 82 to produce the latchable output, instead of using the IC output buffer as shown in FIGS. 4 and 6. The operation of the FIG. 8 cell 80 is the same as in FIG. 4. Although the boundary scan cell 80 uses a normal data buffer 82 to create the Mem2 function instead of using the IC output buffer as shown in FIGS. 4 and 6, the cell 80 still requires less logic than the prior are cells in FIGS. 1 and 7, even without using the output buffer as part of the cell.

Figure 9:
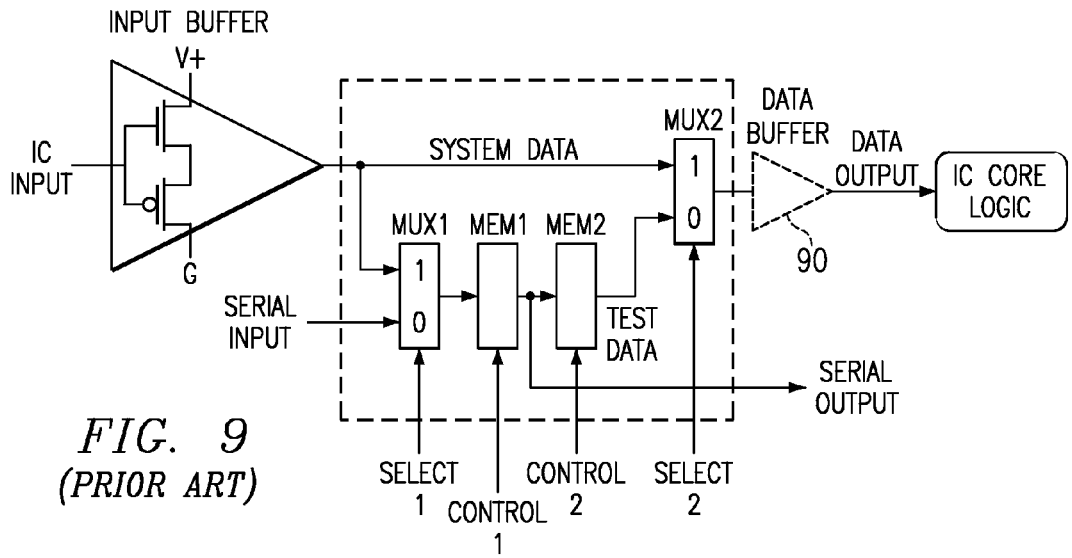
FIG. 9 illustrates a prior art input boundary scan cell structure.

FIG. 9 shows an example of how the prior art boundary scan cell of FIG. 1 is used on IC inputs. During normal IC operation the cell passes data from the output of the input buffer to the IC's core logic, via Mux2. During test mode the cell passes test data from Mem2 to the IC's core logic, via Mux2. In either mode, system data from the input buffer can be captured and shifted out of Mem1, as previously described with respect to the Sample operation. During test mode, the cell type of FIG. 9 allows holding the input to the IC's core logic at a stable state between update operations, via the use of Mem2 and Mux2. This holding of stable test data is important on asynchronous IC inputs like resets, enables, etc. A known problem with this approach is that the strong output drive capability of the input buffer is prevented from being utilized, since the output of Mux2 drives the core logic. In many cases a large data buffer 90 (shown in dotted lines) is required on the output of Mux2 to provide the required drive to the core logic. This high drive data buffer 90 increases logic overhead and introduces an additional delay in the input data signal path.

Figure 10:
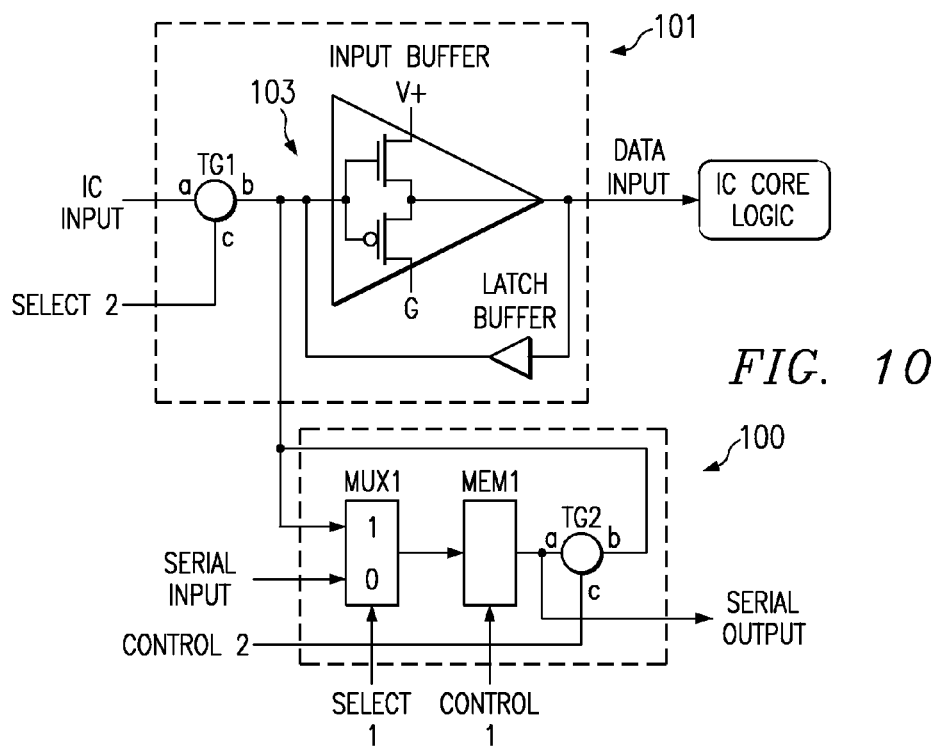
FIG. 10 illustrates an exemplary input boundary scan cell structure according to the present invention.

FIG. 10 illustrates an exemplary boundary scan cell according to the present invention implemented at an IC input. The boundary scan cell is shown in two parts. The first part 100 includes Mux1, Mem1, and TG2, and the second part 101 includes TG1, and a latchable input buffer 103 comprising the IC input buffer and a latch buffer. While the circuit elements of the FIG. 10 boundary scan cell can be placed anywhere in the IC, in the FIG. 10 example the first part 100 is implemented in the IC core logic region, and the second part 101 is implemented in the IC input buffer region. The Mem2 function of the prior art boundary scan cell of FIG. 9 is realized in the input boundary scan cell of FIG. 10 by the combination of TG2, the IC input buffer, and the latch buffer. Also the Mux2 function of the prior art cell of FIG. 9 is realized in FIG. 10 by TG1 and TG2.

During Sample, TG1 is enabled by Select 2 to input data to the IC core logic via the input buffer, and TG2 is disabled by Control 2. Select 1 and Control 1 inputs can be applied to allow the data output from TG1 to be captured and shifted out of Mem1 to provide the Sample operation. During Extest, TG1 is enabled by Select 2 to allow Mem1 to capture and shift out data input to the IC in response to the Select 1 and Control 1 signals. During Intest, TG1 is disabled by Select 2 to block external signal interference while Mux1, Mem1, and TG2 are operated analogously to the previously described cell of FIG. 4 to; (1) capture test data from the output of the latchable input buffer 103, (2) shift data from serial in to serial out, and (3) update new test data to the input of the latchable input buffer 103 to be input to the IC core logic. The latchable input buffer is preloaded with test data from Mem1 at the beginning of Intest in the same way that latchable output buffer 40 is preloaded, as previously described with respect to FIG. 4. The FIG. 10 cell allows the input buffer to drive the core logic and thus eliminates the need for the additional high drive data buffer 90 of FIG. 9 and the signal delay it introduces.

Figure 11:
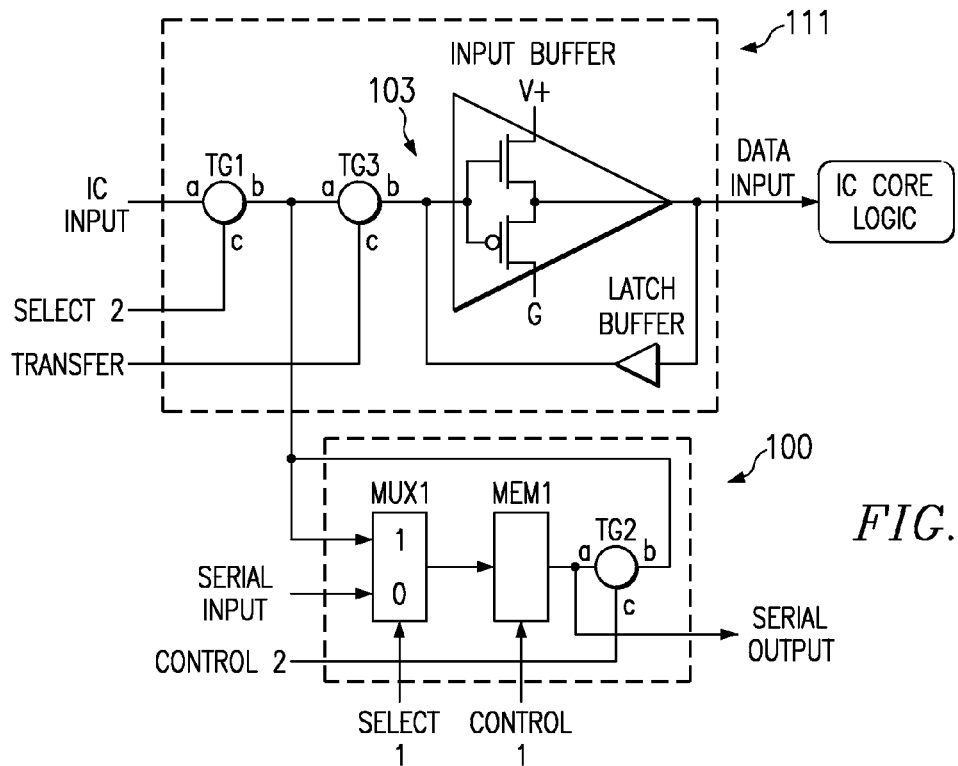
FIG. 11 illustrates another exemplary input boundary scan cell structure according to the present invention.

In FIG. 11, another exemplary boundary scan cell is implemented at an IC input. The FIG. 11 boundary scan cell is similar to the one of FIG. 10 except that the second part 111 includes TG3 at the input of the latchable input buffer 103. TG3 allows the FIG. 11 cell to input a safe logic value to the IC core logic during Extest. The Mem2 function of the prior art boundary scan cell of FIG. 9 is realized in the input boundary scan cell of FIG. 11 by the combination of TG2, TG3, the IC input buffer, and the latch buffer. Also the Mux2 function of the prior art cell of FIG. 9 is realized in FIG. 1 by TG1, TG2 and TG3.

During Sample, TG1 and TG3 are enabled by Select.2 and Transfer to input data to the IC core logic via the input buffer, and TG2 is disabled by Control 2. Select 1 and Control 1 inputs can be applied to allow the data output from TG1 to be captured and shifted out of Mem1 to provide the Sample operation. During Extest, TG1 is enabled by Select 2 to allow Mem1 to capture and shift out data input to the IC in response to the Select 1 and Control 1 signals. In Extest, TG3 is disabled by Transfer to allow the latchable input buffer 103 to hold stable data to the IC core logic during capture and shift operations, which prevents the core logic from seeing the logic input to the input pin during test. The Transfer signal can be controlled to continuously hold safe data to the core logic or can be controlled in conjunction with Control 2 and TG2 to update new test data from Mem1 to the latchable input buffer 103 at the end of each scan operation. During Intest, TG1 is disabled by Select 2 to block external signal interference while Mux1, Mem1, TG2, and TG3 are operated analogously to the previously described cell of FIG. 6 to; (1) capture test data from the output of the latchable input buffer 103, (2) shift data from serial in to serial out, and (3) update new test data to the latchable input buffer 103 to be input to the IC core logic. At the beginning of Intest or Extest, TG2 and TG3 are operated to preload data from Mem1 to the latchable input buffer 103 in the same manner that latchable output buffer 40 is preloaded, as previously described with respect to FIG. 6. The input boundary scan cell implementation of FIG. 11 allows the input buffer to drive the core logic and thus eliminates the need for the additional high drive data buffer 90 of FIG. 9 and the signal delay it introduces.

The above-described invention thus provides advantages including: in FIG. 4 the combination of TG2, the latch buffer, and the output buffer realize the Mem2 function of the prior art boundary scan cells, therefore reducing test logic overhead significantly; in FIG. 6 the combination of TG2 and TG3, the latch buffer, and the output buffer realize the Mem2 function of the prior art boundary scan cells, therefore reducing test logic overhead significantly; one or both of TG1 and TG2 of FIG. 4, and one or more of TG1, TG2, and TG3 of FIG. 6 can be integrated into the output buffer region of the IC to reduce the boundary scan logic required in the IC's core logic to as little as Mem1 and Mux1; in FIG. 4, TG1 and TG2 realize the Mux2 function of the prior art boundary scan cells, therefore reducing test logic overhead significantly; in FIG. 6, TG1, TG2 and TG3 realize the Mux2 function of the prior art boundary scan cells, therefore reducing test logic overhead significantly; the boundary scan cells of FIGS. 4 and 6 allow testing the logic state of the IC output pin, via the latch buffer feedback path, without having to add a third multiplexer, selection control and a short Extest operation as required in the prior art cell of FIG. 3; TG3 of FIG. 6 is bi-directional, allowing output pin data to be passed to Mem1 during Extest capture operations, and allowing Mem1 data to be passed to the output pin's latchable output buffer during Extest or Intest update operations; the latchable output buffer allows for immediate and asynchronous correction of voltage level conflicts at the IC output of the output buffer; a normal data buffer can be used in place of the IC output buffer to achieve the function of Mem2, as seen in FIG. 8; the output boundary scan cell structures of FIGS. 4 and 6 can be adapted for use at IC inputs as shown in FIGS. 10 and 11; the Mem2 function of prior art input boundary scan cells can be realized by using either TG2 and a feedback latch buffer (FIG. 10) or TG2 and a feedback latch buffer and TG3 (FIG. 11), in combination with the IC input buffer; the Mux2 function of prior art input boundary scan cells can be realized by TG1 and TG2 (FIG. 10) or TG1, TG2 and TG3 (FIG. 11); and the input boundary scan cells of FIGS. 10 and 11 allow the IC input buffer to drive the core logic, eliminating the need for a high drive data buffer on the Mux2 output of prior art cells.

Printed wiring boards and other multi-chip modules which include multiple ICs are conventionally powered up with the test logic of the ICs configured to put the IC in its normal operating mode wherein, for example, the IC core logic is connected directly to the IC output buffer to drive off of the IC. However, a newly assembled printed wiring board or other multi-chip module could include defects which cause one or more IC output pins to be shorted to ground, supply voltage, or other IC pins. If such defects exist at the time of initial power up of the newly assembled multi-chip module, then the output buffers which drive the shorted IC pins, which output buffers are directly connected to the core logic of the IC, could be damaged by the short circuits before testing could be done. The invention therefore provides a structure, method and procedure for using the boundary scan cells of FIGS. 4 and 6 in a way that prevents ICs from outputting data on output buffers until testing for shorts has been performed.

Figure 12:
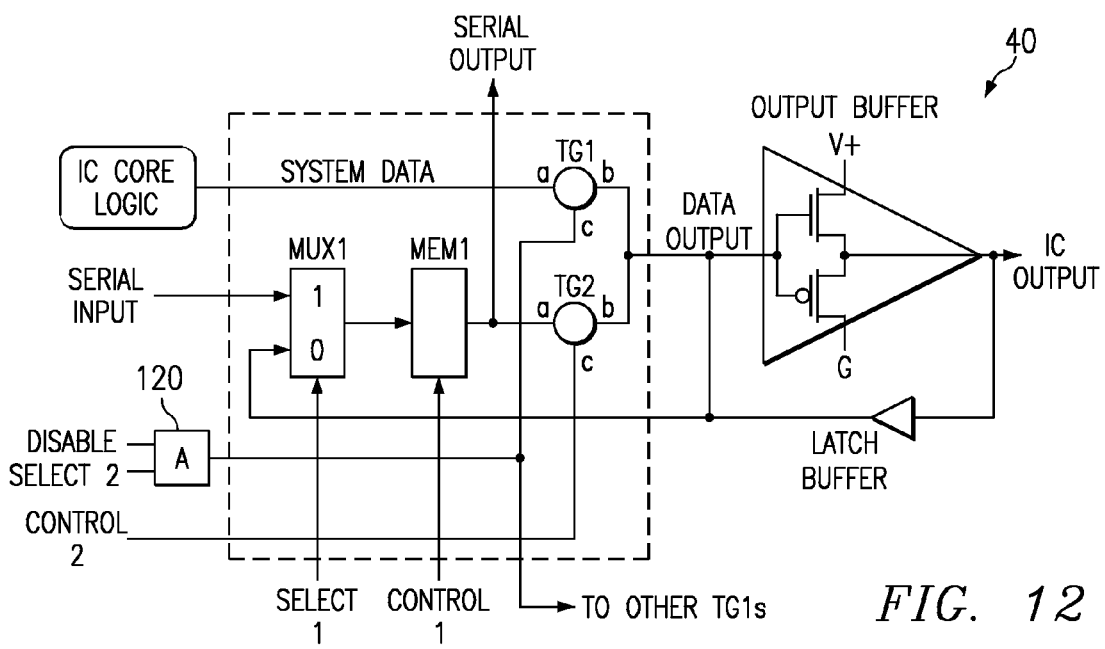
FIG. 12 illustrates a modification to the structure of FIG. 4 to permit safe power up of an IC whose outputs are shorted.

FIG. 12 illustrates a boundary scan cell identical in structure and operation to the one in FIG. 4, except that TG1 is controlled by a signal output from an AND gate 120 instead of the Select 2 signal. The AND gate receives two inputs, Select 2 and Disable. All signals previously described relative to FIG. 4 operate the same in FIG. 12. The Disable signal and the AND gate are the differences between FIGS. 4 and 12. The AND gate is not a required part of each boundary scan cell, but rather is a single gate whose output is input to plural output boundary scan cells in the IC.

When the IC is powered up, the Disable signal is set low. The source of the Disable signal could be an IC input pin. When Disable is low at power up, the latchable output buffer 40 is not driven by the IC core logic, but rather the IC output goes to a stable state in response to feedback from the latch buffer. If a short to ground existed at the IC output, the stable state would be a logic zero. If a short to supply voltage existed at the IC output, the stable state would be a logic one. If no short existed, the stable state would be the logic level input by the latch buffer. The latch buffer could be designed with hysteresis to avoid oscillation of the latchable output buffer 40 when the IC output is not shorted to ground or supply voltages.

Because the low Disable signal serves only to isolate the core logic from the output buffer via TG1, it does not affect the Extest operation as described above relative to FIG. 4. Thus, after the IC has been powered up as described, an Extest operation can be performed as described relative to FIG. 4. Once in Extest operation, the boundary scan cells are operated to test for shorted outputs. It is important to note that the Extest portion of the boundary scan cell is not disabled by the Disable signal, just TG1. If shorts are detected, they are repaired. After repairing shorts, or determining the absence of shorts, the IC is placed in normal operation to enable its function, i.e. boundary scan cell set to normal mode and the Disable signal is inactivated. This sequencing from power up, to output disable, to Extest operation, and then to normal operation (if testing passes) provides a way to protect IC outputs from being damaged by the conventional power up method used with prior art boundary scan cells. This procedure prevents the IC outputs from ever being subjected to voltage contention since the output buffers are not driven by the IC's core logic until the Extest operation has been performed to verify that no output shorts exist or to identify shorts for repair.

The Disable signal need only be used on the initial power up of a newly assembled board containing ICs. After the ICs on the board have been tested for output shorts, the source of the Disable signal (a pin, for example) can be inactivated or removed so that future power up operations will cause the IC to enter normal operation immediately. Alternatively, however, the Disable signal can also be used as desired, for example, each time the board is powered up, or selectively when the board is powered up.

FIG. 13 illustrates how the boundary scan cell of FIG. 6 can be designed to include the safe power up feature. Like the cell in FIG. 12 the Disable signal does not prevent the cell of FIG. 13 from performing the Extest operation, it just disables TG1.

The above-described invention thus provides advantages including: a short circuit test procedure and protection method for newly assembled boards or multi-chip modules; a Disable feature to allow IC output pins to go to non-conflicting states on power up; testing for shorts prior to enabling the IC to enter normal operation; a sequence of steps at power up to insure that no shorts exist on IC output pins; and feedback designed into the IC output buffer, and the ability to disable the core logic output to enable safe IC power up even with outputs shorted.

FIG. 14 illustrates an alternate output cell design that provides Sample, Extest and Intest operations without having to use TG3 of FIG. 6, therefore eliminating its delay on signals during both test and normal IC operation. The output cell of FIG. 14 uses a three input multiplexer (Mux1) and additional select control signals (Select Input) instead of the two input Mux1 of FIGS. 4 and 6. Mux1 of FIG. 14 receives input from the core logic (system data), input from the latchable output buffer 40, and the serial input. Inputting the system data from the core logic directly to Mux1 eliminates the need for the signal isolation capability provided by TG3 in FIG. 6 during Intest. In Sample, TG1 of FIG. 14 is enabled and TG2 is disabled to allow normal system data flow. During Sample operation, Mux1 is controlled to input the system data to Mem1 for capturing and shifting out, as previously described. In Extest, TG1 of FIG. 14 is disabled and TG2 is operated as previously described to update test data to the latchable output buffer 40. During Extest operation, Mux1 is controlled to input the output pin data to Mem1 for capturing and shifting out, as previously described. In Intest, TG1 of FIG. 14 is disabled and TG2 is operated as previously described to update test data to the latchable output buffer. During Intest operation, Mux1 is controlled to input the system data to Mem1 for capturing and shifting out, as previously described.

In the exemplary cell of FIG. 14, the capturing of system and test data signals during Sample and Intest does not require passing the signals through TG1, whereas the cells of FIGS. 4 and 6 can capture and shift out system and test data signals that respectively pass through TG1 during Sample and Intest operations, which verifies the TG1 signal path. However, a special TG1 path test operation can be defined to allow Mux1 of FIG. 14 to capture and shift out system or test data from the output of TG1.

Figure 15:
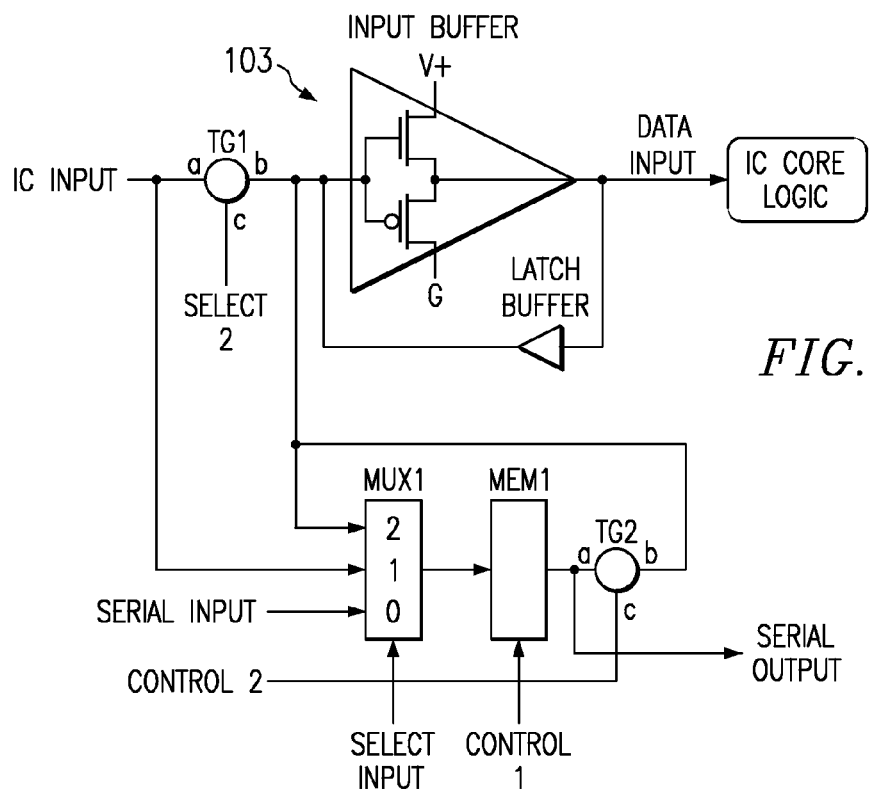
FIG. 15 illustrates another exemplary output boundary scan cell structure according to the present invention.

FIG. 15 illustrates an alternate input cell design that provides Sample, Extest and Intest operations without having to use TG3 of FIG. 11, therefore eliminating its delay on signals during both test and normal IC operation. The input cell of FIG. 15 uses a three input multiplexer (Mux1) and additional select control signals (Select Input) instead of the two input Mux1 of the FIGS. 10-11. Mux1 of FIG. 15 receives input from the input pin, input from the input of the latchable input buffer 103, and the serial input. Inputting the input pin data directly to Mux1 eliminates the need for the signal isolation capability provided by TG3 in FIG. 11 during Extest, since in the cell arrangement of FIG. 15, TG1 provides that function. In Sample, TG1 of FIG. 15 is enabled and TG2 is disabled to allow normal system data flow. During Sample operation, Mux1 is controlled to input data from the latchable input buffer 103 to Mem1 for capturing and shifting out, as previously described In Extest, TG1 of FIG. 15 is disabled and TG2 is operated to update test data from Mem1 to the latchable input buffer, as previously described with respect to FIG. 11. During Extest operation, Mux1 is controlled to input the input pin data to Mem1 for capturing and shifting out, as previously described. In Intest, TG1 of FIG. 15 is disabled and TG2 is operated to update test data from Mem1 to the latchable input buffer 103, as previously described. During Intest operation, Mux1 is controlled to input system data from the output of the latchable input buffer 103 to Mem1 for capturing and shifting out, as previously described with respect to FIG. 11.

Figure 16:
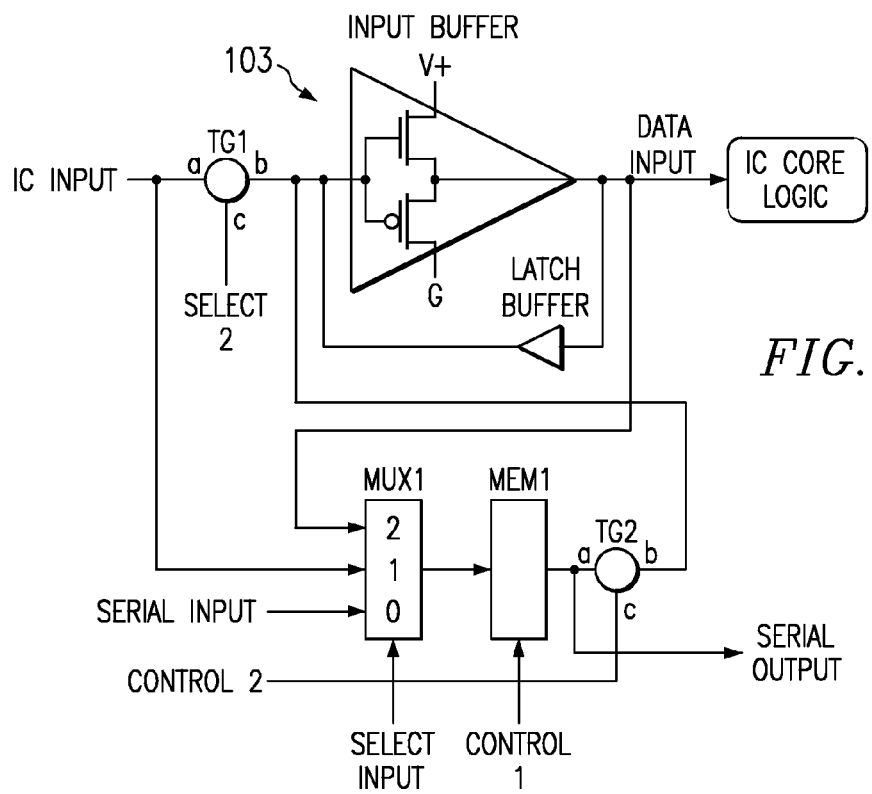
FIG. 16 illustrates another exemplary output boundary scan cell structure according to the present invention.

In FIG. 16, a cell similar to that of FIG. 15 is shown having separate connections for coupling the output of TG2 to the input of the latchable input buffer 103 and for coupling the output of the latchable input buffer to the input to Mux1. The operation of the cell is the same as in FIG. 15. The only difference is that the data update operation from Mem1 to the latchable input buffer (via TG2) and the data capture operation from the latchable input buffer to Mem1 occur over separate connections (i.e. separate and distinct signal paths) instead of over the same connection (i.e. a shared signal path) as shown in the cell of FIG. 15. In FIG. 15, the data output from the latchable input buffer 103 is captured into Mem1 via the feedback path through the latch buffer, whereas in FIG. 16 the data output from the latchable input buffer 103 is captured into Mem1 via the direct connection between the output of the latchable input buffer and Mux1. Some exemplary advantages of the separate connections for updating data to and capturing data from the latchable input buffer are: (1) ability to test the input buffer since the input is controllable and the output is observable via separate connections to the Mux1/Mem1/TG2 test circuitry, and (2) reduction of the load driven by TG1 (Mux1 input is removed from this load), which improves input signaling performance from the input pin, through TG1, to the latchable input buffer 103.

The input and output cells of FIGS. 14, 15 and 16 provide the same advantages as stated for the cells of FIGS. 4, 6, 10 and 11. The output cell of FIG. 14 can also be controlled as described with respect to the output cell in FIG. 12 to provide power up short protection.

Although exemplary embodiments of the present invention are described above, this description does not limit the scope of the invention, which can be practiced in a variety of embodiments.

What is claimed is:

1. An integrated circuit comprising:
    A. core logic circuitry for performing normal operating functions of the integrated circuit and having a system data output lead;
    B. output buffer circuitry having an input selectively connected to the system data output lead and an output;
    C. boundary scan cell circuitry including first switch circuitry selectively connecting the system data output lead to a first node, multiplexer circuitry having an input connected to a serial input, another input connected to the first node, and an output, memory circuitry having an input connected to the output of the multiplexer circuitry and an output connected to a serial output, second switch circuitry selectively connecting the output of the memory circuitry to the first node, and third switch circuitry selectively connecting the first node and the input of the output buffer circuitry; and
    D. latch circuitry having an input connected to the output of the output buffer circuitry and an output connected to the input of the output buffer circuitry, the latch circuitry having less electrical output drive capacity than signals applied to the input of the output buffer circuitry through the first or second switch circuitries.

2. The integrated circuit of claim 1 in which the first switch circuitry includes a control input, the second switch circuitry includes a control input, and the third switch circuitry includes a control input, and including a first control lead connected to the control input of the first switch circuitry, a second control lead connected to the control input of the second switch circuitry, and a third control lead connected to the control input of the third switch circuitry, the first, second and third control leads being separate from one another.

3. The integrated circuit of claim 1 in which the third switch circuitry is bidirectional to carry signals between the first node and the input of the output buffer circuitry.

4. The integrated circuit of claim 1 in which the first switch circuitry, the second switch circuitry, and the third switch circuitry are tristable buffers.

5. The integrated circuit of claim 1 in which the first switch circuitry, the second switch circuitry, and the third switch circuitry are transmission gates.

* * * * *